United States Patent
Chow et al.

(10) Patent No.: US 7,545,224 B2
(45) Date of Patent: Jun. 9, 2009

(54) COST EFFECTIVE LOW NOISE SINGLE LOOP SYNTHESIZER

(75) Inventors: Colin Ka Ho Chow, Brighton, MA (US); David E. O'Brien, Boston, MA (US)

(73) Assignee: Teradyne, Inc., North Reading, MA (US)

( * ) Notice: Subject to any disclaimer, the term of this patent is extended or adjusted under 35 U.S.C. 154(b) by 66 days.

(21) Appl. No.: 11/734,637

(22) Filed: Apr. 12, 2007

(65) Prior Publication Data

US 2008/0252384 A1  Oct. 16, 2008

(51) Int. Cl.
*H03L 7/08* (2006.01)

(52) U.S. Cl. .............................. 331/22; 331/16; 331/18; 331/41

(58) Field of Classification Search .................... 331/16, 331/18, 25; 332/128, 145; 327/3, 5, 40–43, 327/105–107; 342/357.12; 455/76, 260, 455/165.1, 183.1, 313–316; 375/376
See application file for complete search history.

(56) References Cited

U.S. PATENT DOCUMENTS

| | | | |
|---|---|---|---|
| 5,329,253 A * | 7/1994 | Ichihara | 331/17 |
| 5,373,256 A | 12/1994 | Nicotra et al. | |
| 5,847,614 A * | 12/1998 | Gilbert et al. | 331/14 |
| 5,898,325 A | 4/1999 | Crook et al. | |
| 6,373,344 B1 * | 4/2002 | Mar | 331/96 |
| 6,396,355 B1 | 5/2002 | Rezin | |
| 6,570,458 B2 | 5/2003 | Cuddy | |
| 7,215,167 B1 * | 5/2007 | Hassun | 327/158 |
| 2002/0140512 A1 | 10/2002 | Stockton | |

FOREIGN PATENT DOCUMENTS

JP  10-093431 A  4/1998

OTHER PUBLICATIONS

Korean Intellectual Property Office, ISA/KR, International Search Report for International Application No. PCT/US2008/059878, Jul. 15, 2008.

* cited by examiner

*Primary Examiner*—James H. Cho
*Assistant Examiner*—Jany Tran
(74) *Attorney, Agent, or Firm*—Bruce D. Rubenstein

(57) ABSTRACT

A low cost, low phase noise microwave synthesizer includes a DDS modulation circuit and a phase-locked loop. The DDS modulation circuit modulates the output of a DDS to a high frequency. The phase-locked loop downconverts the DDS output and locks the downconverted signal to a relatively low frequency, fixed reference.

25 Claims, 5 Drawing Sheets

US 7,545,224 B2

COST EFFECTIVE LOW NOISE SINGLE LOOP SYNTHESIZER

(B) CROSS-REFERENCES TO RELATED APPLICATIONS

Not Applicable.

(C) STATEMENT REGARDING FEDERALLY SPONSORED RESEARCH OR DEVELOPMENT

Not Applicable.

(D) NAMES OF PARTIES TO A JOINT RESEARCH AGREEMENT

Not Applicable

(E) REFERENCE TO A "SEQUENCE LISTING," A TABLE, OR A COMPUTER PROGRAM LISTING APPENDIX

Not Applicable.

(F) BACKGROUND OF THE INVENTION

1. Field of the Invention

This invention relates generally to automatic test equipment for electronics (ATE) and, more particularly, to the synthesis of low-noise, high frequency periodic signals for testing microwave and RF circuitry.

2. Description of Related Art

Improvements in high-frequency electronic devices for consumer products such as cellular telephones, pagers, and wireless personal data assistants (PDAs), have given rise to a need for improved electronic testing. At the same time, pressures have been applied to product manufacturers to reduce testing costs.

An important component in the testing of high-frequency electronic devices is the microwave synthesizer. As is known, "synthesizers" are electronic instruments that generate test signals of variable frequency. The test signals are generally single frequency "tones" having low noise. Modern synthesizers include programmable electronics that afford them high frequency resolution over a wide range of frequencies. "Microwave synthesizers" are synthesizers that produce output signals in the microwave frequency band, i.e., in the vicinity of 1 Gigahertz ($10^9$) or higher.

A common type of test for a high frequency device involves measuring the electronic noise that the device produces. To perform this type of test, the device under test, or "DUT," is connected to a test system, or "tester." The tester generally includes power supplies, a microwave synthesizer, and a sampling instrument. Under control of a test program, the tester activates the power supplies to apply power to the DUT, enables the synthesizer to apply an input signal to the DUT, and enables the sampling instrument to measure an output signal from the DUT. Noise on the output signal is then measured, and measured noise is compared with test limits to determine whether the DUT's noise performance is within the test limits.

For many high-frequency devices, the output signals from the DUT are generally a function of the input signals applied to the DUT. For example, if the input signal has a frequency FIN, the output generally also has the frequency FIN, or a multiple thereof. The exact input-output relationship depends upon the type of device being tested, but some numerical relationship between input and output is almost always present. This being the case, any noise produced by the synthesizer may appear at the output signal. This noise creates an uncertainty in any noise measurement of the DUT, since it is not clear whether the noise being measured is produced by the DUT or injected by the synthesizer.

Therefore, the noise of the synthesizer is a most important specification. By reducing this noise, measurement uncertainties are correspondingly reduced, and the quality of testing is improved.

Because many electronic devices employ some sort of phase modulation scheme, it is particularly critical that synthesizers produce low phase noise. As is known, "phase noise" refers to variations in the phase of signals produced by a device. Phase noise can alternatively be viewed as timing jitter.

Test system developers have sought to develop microwave synthesizers with low phase noise. Their efforts have often entailed developing synthesizers consisting of multiple, adjustable phase-locked loop circuits that operate in unison.

FIG. 1 shows an example of a conventional multi-loop synthesizer 100. The synthesizer 100 shows a synthesizer having three loops; however, it should be understood that multi-loop designs may include a greater or lesser number of loops, as the target application requires.

In the multi-loop synthesizer 100 of FIG. 1, a main phase-locked loop 102 receives a baseband input signal (Baseband In) and produces a microwave output signal (RFOUT). The main phase-locked loop 102 includes a phase comparator 110, a loop filter/amplifier 112, and a VCO (voltage-controlled oscillator) 114, in its forward path, and a series of mixers 116/120 and filters/amplifiers 118/122 in its feedback path.

Additional phase-locked loops 104 and 106 are provided to generate additional high frequency signals. The phase-locked loops 104 and 106 each include a phase comparator 134/154, a loop filter/amplifier 136/156, a VCO 138/158, and a feedback divider 140/160. Input dividers 132/152 are provided to respectively divide an input signal from a clock source 130.

The outputs of the phase-locked loops 104 and 106 are coupled to the mixers 116 and 120 in the main loop 102. The mixers 116 and 120 successively downconvert RFOUT, to produce a much lower frequency feedback signal. The phase detector 110 compares the relatively low frequency feedback signal with Baseband In, and the operation of the loop 102 tends to force the feedback signal to a frequency that equals Baseband In.

To program a desired output frequency, RFOUT, both coarse and fine adjustments are made. The dividers 132, 152, 140, and 160 of loops 104 and 106 are adjusted to establish a coarse output frequency. Baseband In is adjusted, e.g., by programming a direct digital synthesis device (DDS) to tune between the coarse frequency settings made by the dividers.

Many design features of the multi-loop synthesizer 100 promote low phase noise. For example, the clock source 130 is generally a low noise, fixed frequency reference, such as a crystal oscillator. The filters/amplifiers 136 and 156 generally have long time constants, for reducing noise injected into the mixers 116 and 120 of the main loop 102. The main loop 102 is generally free of frequency division, which tends to reduce noise amplification.

The significant benefits of the multi-loop design 100 come at a cost, however. The component count of the circuit is high, and many filters are required. These filters are costly and occupy a large amount of space. In addition, because the multi-loop synthesizer 100 includes multiple feedback circuits that interact, the settling time of the synthesizer 100 is sometimes difficult to predict.

What is needed is a microwave synthesizer that has low phase noise, has predictable settling characteristics, and can be built at lower cost than multi-loop designs.

(G) BRIEF SUMMARY OF THE INVENTION

In accordance with one embodiment of the invention, a microwave synthesizer includes a reference oscillator for generating a reference frequency, a DDS modulation circuit for generating a modulated DDS signal, and a phase-locked loop circuit, coupled to the reference oscillator and the DDS modulation circuit, for generating a variable frequency output signal. The phase-locked loop circuit includes a phase comparison circuit having a first input coupled to the reference oscillator, a second input for receiving a feedback signal, and an output. The phase-locked loop circuit further includes a controllable oscillator having a control input coupled to the output of the phase comparison circuit and an output for generating the variable frequency output signal. In addition, the phase-locked loop circuit includes a mixer circuit having a first input coupled to the DDS modulation circuit, a second input coupled to the output of the controllable oscillator, and an output coupled to the second input of the phase comparison circuit.

In accordance with another embodiment of the invention, a microwave synthesizer includes a phase comparison circuit having a first input for receiving a reference frequency, a second input for receiving a feedback signal, and an output. Also included is a controllable oscillator having a control input coupled to the output of the phase comparison circuit and an output for generating a variable frequency output signal. Further included is a programmable divider having an input coupled to the output of the controllable oscillator and an output for providing a divided signal. The microwave synthesizer still further includes a mixer circuit having a first input adapted for receiving a modulated signal, a second input coupled to the output of the programmable divider, and an output coupled to the second input of the phase comparison circuit for providing the feedback signal.

In accordance with a further embodiment of the invention, a microwave synthesizer includes a reference oscillator for generating a reference frequency. The microwave synthesizer includes a plurality of frequency multiplying units is coupled to the reference oscillator for generating respective output signals each at a different multiple of the reference frequency. Further included is a first DDS unit having a clock input coupled to the plurality of frequency multiplying units and an output for generating a first DDS signal having a programmable frequency and a first phase. In addition, the microwave synthesizer includes a second DDS unit having a clock input coupled to the plurality of frequency multiplying units and an output for generating a second DDS signal having the programmable frequency and a second phase different from the first phase. A quadrature mixer circuit has a first and second inputs respectively coupled to the outputs of the first and second DDS circuits, a third input coupled to the plurality of frequency multiplying units, and an output. The microwave synthesizer further includes a phase-locked loop circuit, having a first input coupled to the reference oscillator, a second input coupled and to the output of the quadrature mixer circuit, and an output for providing a variable frequency output signal.

(H) BRIEF DESCRIPTION OF THE SEVERAL VIEWS OF THE DRAWINGS

Novel features of the invention will become apparent from consideration of the ensuing description and drawings, in which—

(I) DETAILED DESCRIPTION OF THE INVENTION

As used throughout this document, the words such "comprising," "including," and "having" are intended to set forth certain items, steps, elements, or aspects of something in an open-ended fashion. Unless a specific statement is made to the contrary, these words do not indicate a closed list to which additional things cannot be added.

Figure 1:
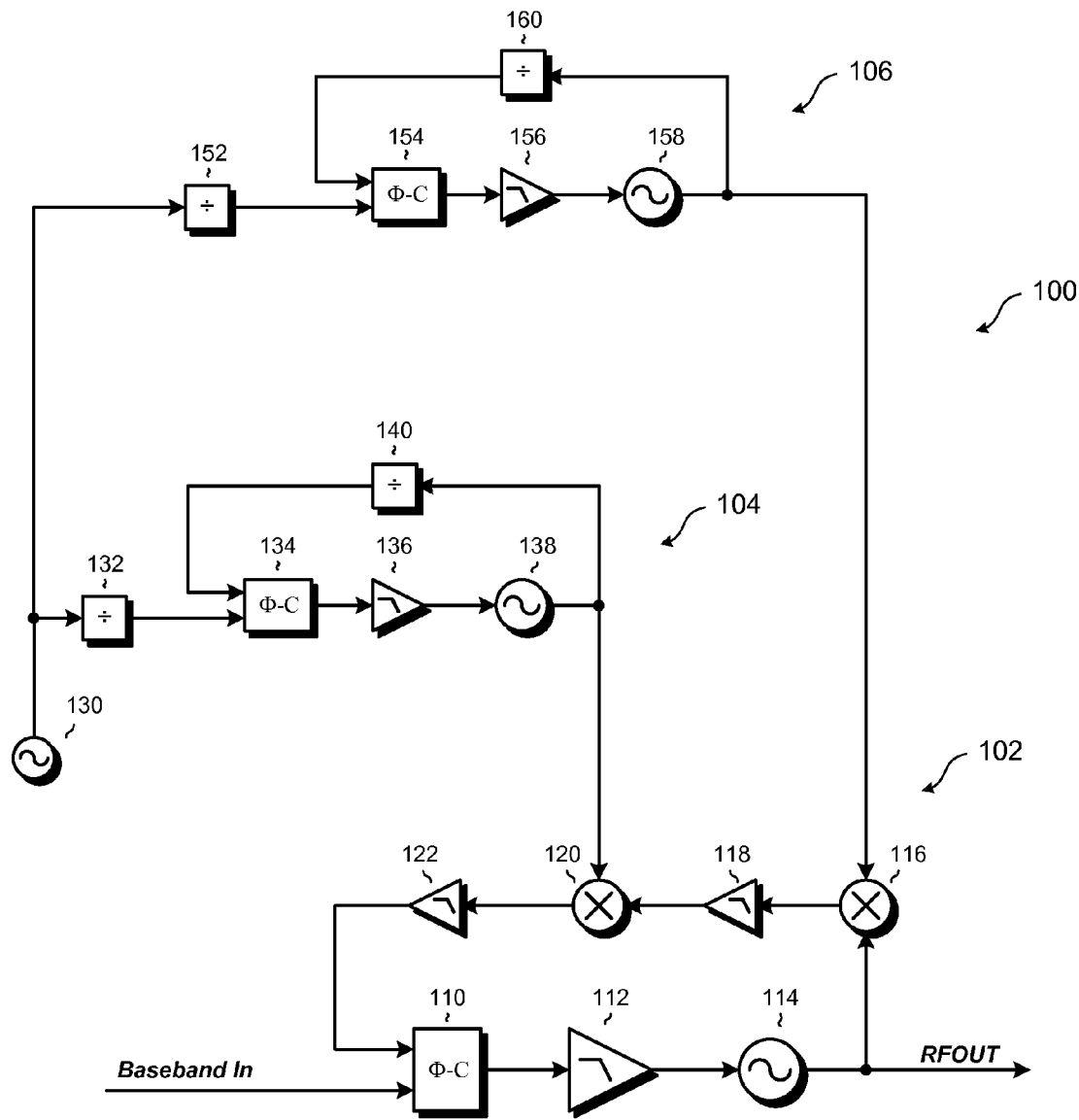
FIG. 1 is a simplified schematic of a multi-loop microwave synthesizer according to the prior art.
Figure 2:
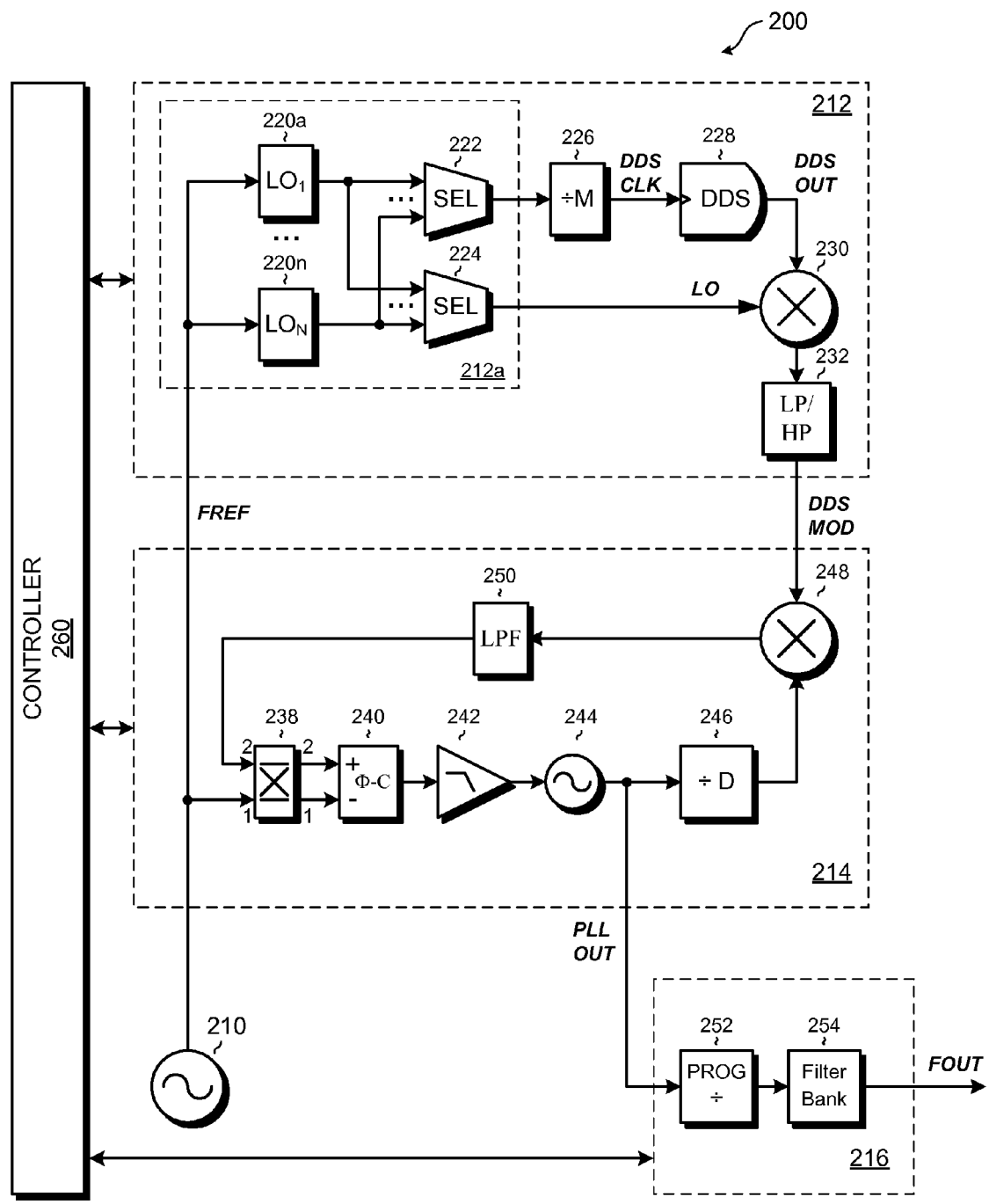
FIG. 2 is a simplified schematic of a microwave synthesizer according to an embodiment of the invention.

FIG. 2 shows a microwave synthesizer 200 according to an illustrative embodiment of the invention. The microwave synthesizer 200 includes a reference oscillator 210, a DDS modulation circuit 212, a phase-locked loop circuit 214, an output conditioning circuit 216, and a controller 260. The controller 260 provides inputs to and receives outputs from the DDS modulation circuit 212, phase-locked loop circuit 214, and output conditioning circuit 216, for controlling these circuits and optionally reading information back from these circuits.

The DDS modulation circuit 212 preferably includes a plurality of local oscillators 220a-220n. Each local oscillator preferably has an input coupled to the reference oscillator 210, and an output for providing a signal whose frequency is a multiple of the reference frequency. The output frequencies of the different local oscillators 220a-220n are preferably different from one another. The local oscillators 220a-220n are coupled to the inputs of a pair of selectors 222 and 224. Each selector 222/224 preferably has "n" inputs, one for each of the "n" local oscillators. Each selector is configured to convey one of the signals at its "n" inputs to its output, under control of the controller 260. The selector 222 has an output coupled to a frequency divider 226, which, in turn, has an output, DDS CLK, connected to the clock input of a DDS circuit 228. The DDS circuit 228 has an output, DDS OUT, coupled to a first input of a mixer 230. The selector 224 has an output (LO) coupled to a second input of the mixer 230. The selectors 222 and 224 are preferably implemented with RF switches. A selectable filter 232 is optionally coupled to the output of the mixer 230. The filter 232 is preferably configurable as either a low pass filter or a high pass filter. The output of the filter 232 conveys a modulated DDS signal, DDS MOD, to the phase-locked loop circuit 214.

The phase-locked loop circuit 214 includes a phase comparator 240, a loop filter 242, and a controllable oscillator 244. A crossover switch 238 is preferably provided at the input of the phase comparator 240. The crossover switch has a first input coupled to the reference oscillator and a second input for receiving a feedback signal. It also has two outputs coupled to first and second inputs of the phase comparator 240. The crossover switch 238 has two modes: a pass-through mode in which inputs are passed directly to outputs (input 1 to output 1 and input 2 to output 2), and a crossover mode in which inputs are crossed (input 1 to output 2 and input 2 to output 1). The crossover switch 238 maybe provided as a distinct element, or it may be integrated with the phase comparator 240.

The crossover switch 238 allows the polarity of the phase comparator 240 to be reversed. This ability affords the synthesizer 200 with greater flexibility for locking.

The phase-locked loop circuit 214 also includes a programmable divider 246, a mixer 248, and a low-pass filter 250. The programmable divider 246 has an input coupled to the output of the controllable oscillator 244, and an output coupled to a first input of the mixer 248. The mixer 248 has a second input coupled to the DDS modulation circuit, for receiving DDS MOD. The mixer 248 has an output coupled to the low pass filter 250, which in turn has an output coupled to the second input of the crossover switch 238.

The output of the phase-locked loop circuit 214, PLL OUT, is coupled to the output conditioning circuit 216. The output conditioning circuit includes one or more programmable dividers 252 and a filter bank 254.

The microwave synthesizer 200 preferably operates in synchronization with the reference oscillator 210. Within the DDS modulation circuit 212, the local oscillators 220a-220n each receive a reference frequency FREF from the reference oscillator 210 and produce an output signal whose frequency is a multiple of the reference frequency. The selector 222 is operated to select an output signal from one of the local oscillators 220a-220n for input to the divider 226. Similarly, the selector 224 is operated to select that output signal an output of one of the local oscillators for input to the mixer 230.

With the selectors 222/224 and the divider 226 set to desired values, the DDS circuit 228 is programmed to produce DDS OUT at a desired frequency. The mixer 230 mixes DDS OUT with LO from the selector 224. The frequency content of the mixer's output thus generally includes a carrier component, LO, and upper and lower sidebands offset from the carrier by the frequency of DDS OUT. The selectable filter 232 preferably filters the output of the mixer 230 to select either the lower sideband or the upper sideband to yield DDS MOD, which is then passed to the phase-locked loop circuit 214.

Within the phase-locked loop circuit 214, the output of the controllable oscillator 244, PLL OUT, provides frequencies in the microwave range. The programmable divider 246 reduces these frequencies, and the mixer 248 downconverts the output of the divider 246. The output of the mixer 248 thus generally includes the divided PLL OUT frequency with sidebands offset by the frequency of DDS MOD. The low pass filter 250 filters the higher mixing products produced by the mixers 230 and 248. Since the low pass filter 250 provides the feedback signal, the loop's negative feedback tends to drive the lower sideband of the mixer 248 to the reference frequency, FREF, and therefore tends to drive PLL OUT to a predetermined microwave frequency. The frequency of PLL OUT can then be divided and filtered as desired to produce arbitrarily lower frequencies.

Algebraically, DDS MOD can be represented as (LO+DDS OUT) or (LO−DDS OUT), depending on the settings of the filter 232. If the programmable divider 246 has a division factor of D and the crossover switch 238 is configured in its pass-through mode, the sideband to which the phase comparator 240 locks has a frequency of either (PLL OUT)/D−(LO+DDS OUT) or (PLL OUT)/D−(LO−DDS OUT).

The crossover switch 238 allows the loop to maintain negative feedback and lock when the synthesizer is pre-tuned and configured to produce (PLL OUT)/D at a lower frequency than DDS MOD. By configuring the crossover switch 238 to its crossover mode, the sideband to which the phase comparator 240 locks has the following additional frequencies:

(LO+DDS OUT)−(PLL OUT)/D and (LO−DDS OUT)−(PLL OUT)/D.

Since feedback forces each of the above expressions to equal the reference frequency, we can solve for PLL OUT to yield four possibilities, as follows:

$PLL\ OUT = D*(LO+DDS\ OUT+FREF)$ $PLL\ OUT = D*(LO-DDS\ OUT+FREF)$ $PLL\ OUT = D*(LO+DDS\ OUT-FREF)$ or $PLL\ OUT = D*(LO-DDS\ OUT-FREF)$.

It is apparent that a proper selection of values for D, FREF, LO, and DDS OUT can yield a wide frequency range for PLL OUT, which translates into a wide frequency range for the microwave synthesizer 200.

Figure 3:
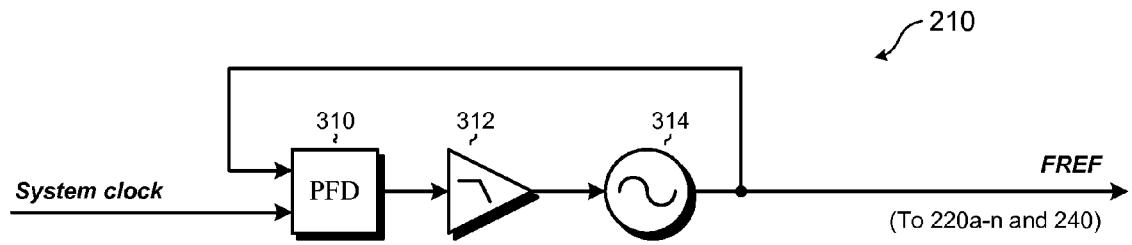
FIG. 3 is a schematic of an embodiment of a frequency reference source, which can be used in the synthesizer of FIG. 2.

FIG. 3 shows an illustrative embodiment of the reference oscillator 210. The oscillator includes a phase-locked loop driven from a system clock. The phase-locked loop includes a phase-frequency detector 310, a loop filter 312, and a controllable oscillator 314. As is known, a phase-frequency detector is a type of phase detector that can detect a mismatch in frequency as well as phase between its input signals. The phase-frequency detector 310 has a first input that receives the system clock and a second input that provides a feedback signal from the controllable oscillator 314. The phase-locked loop thus provides a filtered and purified version of the system clock.

The system clock is preferably a signal distributed to different equipment in an ATE system for synchronizing operation. It may be a digital clock or an analog clock. The exact frequency is not critical. The loop filter 312 preferably has a very low bandwidth for strongly filtering phase noise within the loop. The controllable oscillator 314 is preferably a voltage-controlled crystal oscillator, such as a low cost, ceramic resonator.

Figure 4:
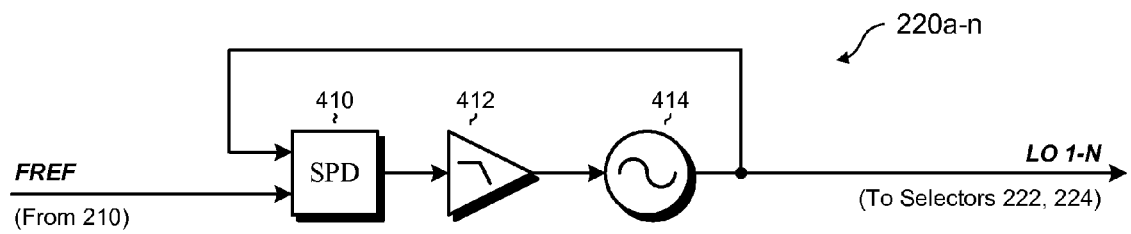
FIG. 4 is a schematic of an embodiment of a circuit for generating a high-frequency local oscillator (LO), which can be used in the synthesizer of FIG. 2.

FIG. 4 shows an illustrative embodiment of a local oscillator (any of 220a-220n). Only a single oscillator is shown, but the circuit topology is representative of each of the oscillators 220a-220n. The local oscillator receives the filtered clock signal, FREF, and produces an output signal whose frequency is a multiple of FREF. The local oscillator is constructed as a phase-locked loop; however, a sampling phase detector 410 is used in place of the conventional phase detector or phase-frequency detector. As is known, a sampling phase detector employs a step recovery diode capacitively coupled to a Schottky diode pair mixer. The step recovery diode generates harmonics of the input reference signal (here, FREF), and the Schottky diode pair acts as a phase detector. The sampling phase detector can selectively lock on a harmonic and enables the phase-locked loop to achieve frequency multiplication of the input reference without the need for a feedback divider. As is known, eliminating the feedback divider in a sampling phase detector based phase-locked loop not only avoids the noise contribution of the divider but also multiplication of the phase detector noise. Avoiding dividers in the local oscillators 220a-220n thus improves performance. In place of the sampling phase detector 410, a comb generator loop can be used.

Figure 5:
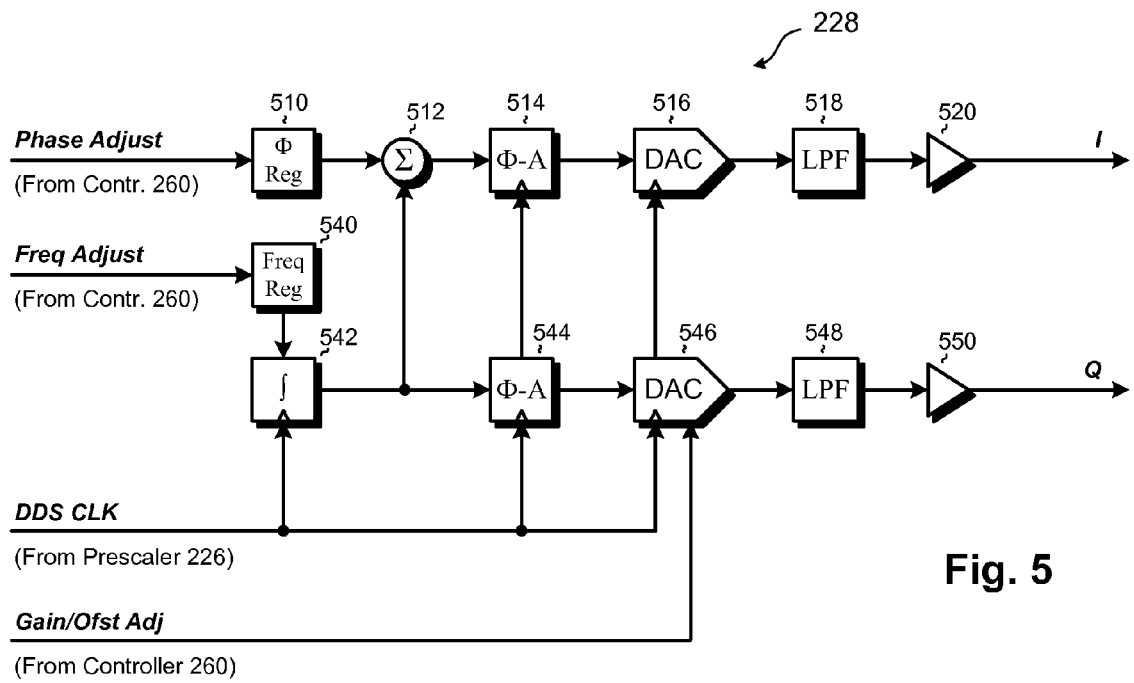
FIG. 5 is a schematic of an embodiment of a DDS circuit for generating quadrature DDS signals, which can be used in the synthesizer of FIG. 2.
Figure 6:
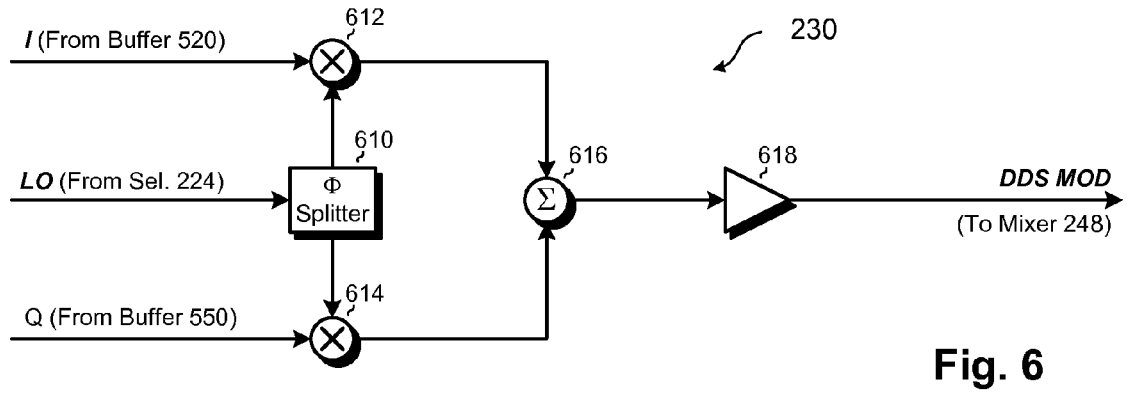
FIG. 6 is a schematic of an embodiment of a single sideband upconverter, for receiving quadrature DDS signals shown in FIG. 5.

FIGS. 5 and 6 show an embodiment of the DDS circuit 228 and mixer 230. This embodiment is particularly preferred, because of its low cost, flexibility, and simplicity of integration in the synthesizer 200. This embodiment exploits a trend in the telecommunications industry toward processing signals analytically, i.e., in quadrature. As is known, "quadrature" signals represent any frequency as a pair of ninety degree phase-shifted sinusoids. One sinusoid is in-phase, or "I," and the other is quadrature, or FIG. 5 shows a quadrature DDS circuit. The quadrature DDS circuit includes a pair of DDS units—one for providing an I signal and one for providing a Q signal. Each DDS unit preferably includes a phase-to-amplitude converter 514/544, a DAC (digital-to-analog converter) 516/546, a low pass filter 518/548, and an output buffer 520/550. For economy, certain elements can be shared between the DDS units and need not be replicated. For example, only a single phase register 510, summer 512, frequency register 540, and accumulator 542 need be provided.

To operate the quadrature DDS circuit, the controller 260 programs the phase register 510 and frequency register 540 with values. Upon each cycle of DDS CLK, the accumulator 542 adds the contents of the frequency register 540 to its already stored value, to produce an increasing digital output value that corresponds to phase. This output is provided to the phase-to-amplitude converters 514/544, which convert the increasing phase values to digital amplitude values. The DACs 516/546 then convert the digital amplitude values into analog levels. The filters 518/548 smooth these levels, and the buffers 520/550 output the I and Q signals. Output frequency of I and Q is varied by varying the value stored in the frequency register 540.

The phase register 510 and summer 512 allow the phase of the I output to be offset with respect to the phase of the Q output. By programming the phase register 510 to a digital value that corresponds to 90 degrees, a phase difference of 90 degrees is established between I and Q. Similarly, by programming the phase register to minus 90 degrees, a negative 90 degree phase difference is established between I and Q.

The quadrature DDS circuit also provides a mechanism for removing errors in and between I and Q. Phase errors can be corrected by adjusting the value stored in the phase register 510. Gain and offset errors in the DACs can be corrected using analog adjustments provided by the controller 260. The quadrature DDS circuit is preferably implemented with a pair of monolithic DDS chips, or with a dual core, monolithic DDS.

FIG. 6 shows the preferred implementation of the mixer 230, in the form of a quadrature mixer. The quadrature mixer preferably includes a phase splitter 610, first and second mixers 612 and 614, a summer 616, and an output buffer 618. The phase splitter 610 receives the LO signal from the selector 224 and outputs two versions of the LO signal. Each version has the same frequency as the LO signal, but one of them is delayed 90 degrees relative to the other. The first mixer 612 mixes a non-shifted version of LO with the I signal, and the second mixer 614 mixes a shifted version of LO with the Q signal. The summer 616 combines the outputs of the mixers 612 and 614 to yield an output signal in which in-phase (I) components are summed and quadrature components (Q) are rejected. The output of the summer 616 thus has a frequency that is either the sum or difference of LO and the DDS output frequency, DDS OUT. Other mixing products are suppressed without the need for filtering. The desired sum or difference signal can be changed by reversing the phases of I and Q. Therefore, the quadrature mixer can be made to output either LO+DDS OUT or LO−DDS OUT simply by programming the phase register 510 to either plus 90 degrees or minus 90 degrees.

The quadrature mixer shown in FIG. 6 is also known as a single-sideband upconverter. Single-sideband upconverters are well known in the microwave and telecommunication arts. The advantage of using a single-sideband upconverter in this application is that it provides an easy way of selecting a desired sideband (and thus a desired frequency range) for passage to the phase-locked loop circuit 214. It also significantly reduces the need for filtering. The selectable filter 232 from FIG. 2 can generally be eliminated when the single-sideband upconverter is used.

Figure 7:
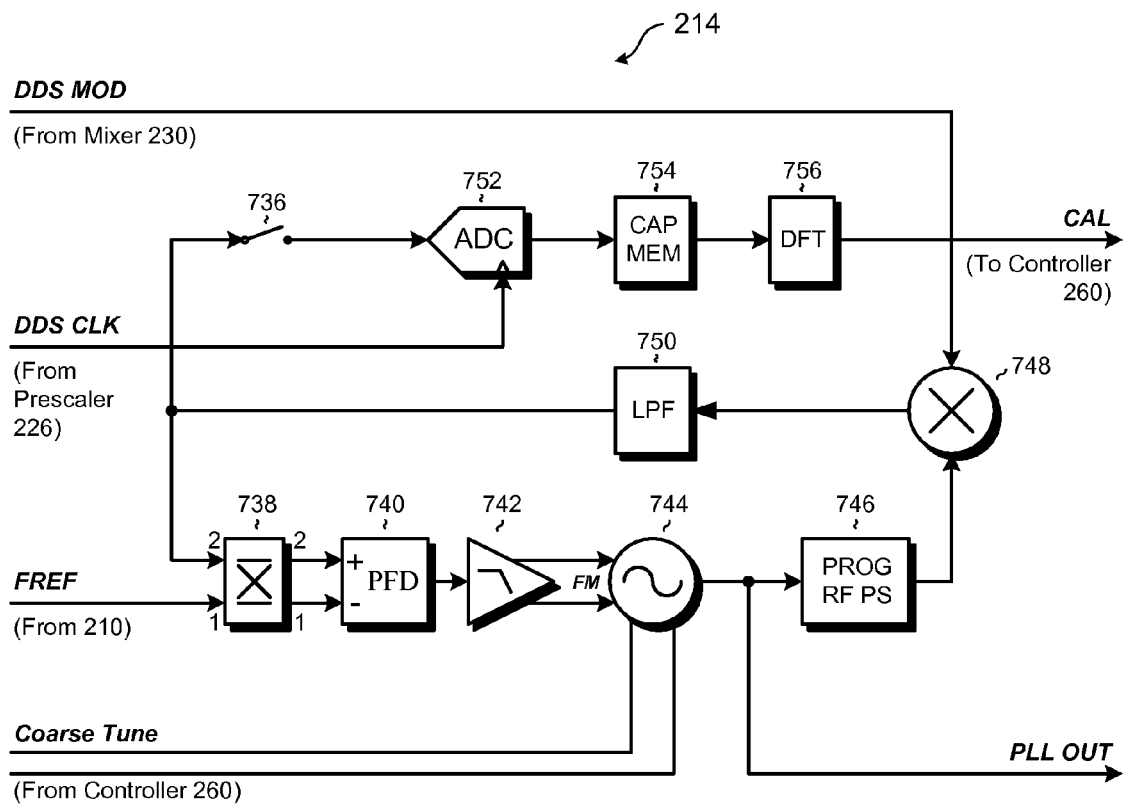
FIG. 7 is a schematic of an embodiment of a main PLL circuit shown in FIG. 2.

FIG. 7 shows an embodiment of the phase-locked loop circuit 214. It can be seen that the phase comparator 240 has been implemented with a phase-frequency detector 740. The controllable oscillator 244 is implemented with a YIG oscillator. The divider 246 is implemented with a programmable RF prescaler 746. The mixer 748 and low pass filter 750 are similar to the mixer 248 and filter 250 of FIG. 2.

The phase-frequency detector (PFD) 740 allows the phase-locked loop of FIG. 7 to acquire and lock over a relatively wide frequency range, and relaxes the need for pretuning of the YIG oscillator. The PFD is operated at a relatively low frequency (nominally 100 MHz). Inexpensive, low noise, monolithic PFDs are commercially available for use at this frequency.

The YIG oscillator 744 preferably has both coarse tune and fine tune (FM) inputs. The coarse tune inputs are preferably controlled by analog circuitry within the controller 260, whereas the fine tune inputs are preferably coupled to loop filter/amplifier 742 for locking.

The phase-locked loop circuit of FIG. 7 preferably includes a sampling circuit for sampling the feedback signal provided to the PFD 740. The sampling circuit includes a switch 736, an ADC (analog-to-digital converter) 752, a capture memory 754, and a DFT (digital Fourier transform) unit 756. During a calibration operation, the switch 736 is closed and the ADC 752 is made to acquire samples of the feedback signal. These samples are held in the capture memory 754, and a discrete Fourier transform is performed on the stored samples. Results can be sent to the controller 260 for analysis. This capability allows the noise of the phase-locked loop circuit to be directly measured, and possibly adjusted.

Implementation details of the microwave synthesizer 200 described herein can be varied substantially within the scope of the invention. In the particular preferred embodiment, however, the value of FREF is nominally 100 MHz. The number "n" of local oscillators 220a-220n is 2. The first local oscillator generates 1.8 GHz and the second local oscillator generates 2.0 GHz. For compatibility with preferred and available DDS units, the divider value M of the divider 226 is preferably 2. Therefore, the value of DDS CLK can be configured to either 900 MHz or 1.0 GHz. The DDS units are preferably tunable in a range between 100 MHz and 300 MHz, making DDS MOD variable between 1.5 GHz and 2.3 GHz, with no gaps. The YIG oscillator 744 is preferably operated over a tuning range between 6.4 and 12.8 GHz, and the programmable RF prescaler preferably provides division ratios of 4, 5, or 6. The small division ratios ensure that noise is kept low, while still satisfying the feedback requirements of the loop over the full range of DDS MOD.

Many of the components used in the synthesizer 200 are commercially available off the shelf. Suitable phase-frequency detectors are available from both Hittite Microwave of Chelmsford, Mass., and ON Semiconductor of Phoenix, Ariz. Sampling phase detectors are available from MicroMetrics of Londonderry, N.H., and Aeroflex/Metelics of Sunnyvale, Calif. Suitable DDS circuits can be obtained from Analog Devices of Norwood, Mass. Single-sideband upconverters can be purchased from Analog Devices, Maxim Integrated Products of Sunnyvale, Calif., Texas Instruments of Dallas, Tex., and Linear Technology of Milpitas, Calif.

Figure 8:
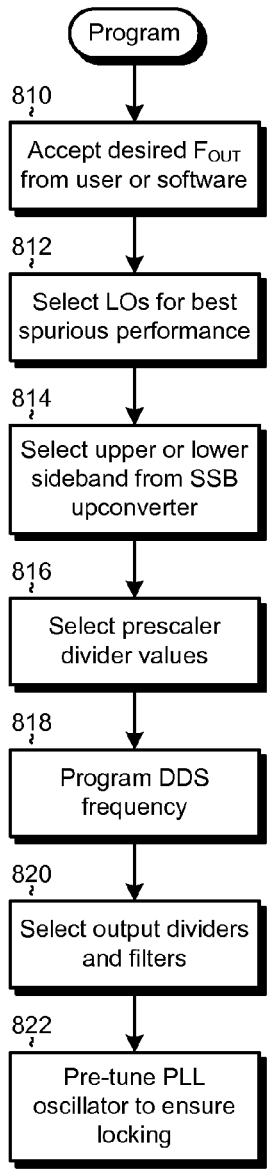
FIG. 8 is a flowchart showing a process for programming the synthesizer of FIG. 2.

FIG. 8 shows a process for programming the microwave synthesizer 200 to provide a desired output frequency. The steps need not be performed in the order shown. At step 810, the synthesizer accepts a desired output frequency from a user directly or from a test program that has access to the synthesizer. At step 812, one or more local oscillators are selected. For flexibility, local oscillators 220a-220n, for providing DDS CLK and LO, are preferably selected independently. At step 814, a sideband is selected from the single-sideband upconverter. This is generally accomplished by programming the phase of the phase register 510 to either plus or minus 90 degrees and configuring the crossover switch 738 to either pass-through or crossover mode. At step 816, a prescaler divider value is selected for the programmable RF prescaler 746. At step 818, a DDS frequency is programmed. Output dividers and filters are configured at step 820, and the YIG oscillator 744 is pre-tuned at step 822 to output a frequency within an expected range.

Selection of the local oscillator(s) 220a-220n, the upper or lower sideband, and the prescaler values are made based primarily on two factors. The first factor is the ability to achieve the desired output frequency. Not all configurations can achieve all desired frequencies. The second factor is minimization of spurious noise. An advantage of the synthesizer 200 is that, in many instances, there are different configurations for achieving the same output frequency. In these instances, the configuration yielding the lowest noise, especially the lowest phase noise, is preferably selected.

The following guidelines may be used in configuring the synthesizer 200 to minimize spurious noise:

1. If the frequency of DDS OUT is close to a subharmonic of one of the LO frequencies, select an LO frequency (e.g., 900 MHz or 1 GHz) for which subharmonics are farther away;

2. If higher order mixing products from the SSB upconverter and/or mixer 248 create close-in spurs at the output of the mixer 248, perform one of the following:
   a) Choose a different ratio for the prescaler 246.
   b) Invert the polarity of the crossover switch 238, which may move the problematic spur out of band.
   c) If neither a) nor b) is feasible, implement a focused calibration to minimize the offending spur. Calibration is described in connection with FIG. 10, below.
3. If multiple configurations exist (with no close-in spurs) for the same synthesizer output frequency, choose the one that has the lowest DDS output frequency.

Figure 9:
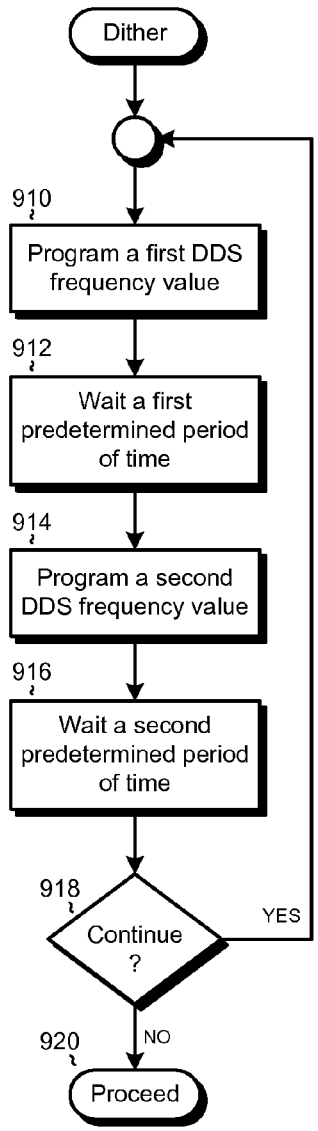
FIG. 9 is a flowchart showing a process for dithering two DDS values for outputting a frequency corresponding to a value between the two DDS values in the circuit of FIG. 2.

FIG. 9 shows a process for using the microwave synthesizer 200 for generating a desired output frequency, when the output frequency cannot directly be programmed. The need for this process arises because the resolution of the DDS circuit is limited and sometimes a desired value falls between the values produced by immediately adjacent DDS levels. According to this process, two directly programmable frequency values that yield frequencies proximate to the desired frequency are dithered. The filtering action of the phase-locked loop circuit 214 averages the dithered values to produce the desired frequency value.

This process is conducted as follows. At step 910, the synthesizer 200 is configured and the DDS circuit is programmed to produce a first frequency value from the synthesizer, proximate to the desired output frequency. After waiting a first delay interval (step 912), the DDS circuit is programmed to produce a second frequency value from the synthesizer (step 914). The second frequency value is also proximate to the desired output frequency, but is on the opposite side of the desired value compared with the first frequency value. After a second delay interval (step 916), the process is repeated, with different values alternately being programmed. Due to the operation of the phase-locked loop circuit 214, the output frequency settles upon the time weighted average of the first and second frequency values.

Figure 10:
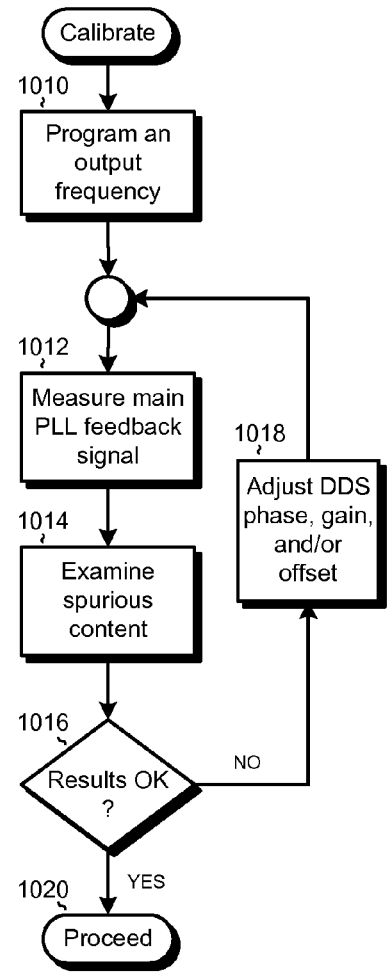
FIG. 10 is a flowchart showing a process for calibrating the synthesizer of FIG. 2, when it is configured with the quadrature DDS shown in FIG. 5.

FIG. 10 shows a process for calibrating the microwave synthesizer 200. As was seen in FIG. 5, the quadrature DDS circuit includes provisions for adjusting the phase difference between the I and Q output signals, and provisions for adjusting the gain and phase of the DACs 516 and 546. As was seen in FIG. 7, the phase-locked loop circuit includes a sampling circuit (switch 736, ADC 752, capture memory 754, and DFT unit 756). The sampling circuit can be used for measuring noise in the feedback signal of the phase-locked loop circuit 214. According to the calibration process, the synthesizer 200 is programmed to produce a known output frequency (step 1010). Once the output frequency has stabilized, the switch 736 is closed and the sampling circuit is made to sample the feedback signal (step 1012). Spurious noise is measured and examined (step 1014). At step 1018, the DDS circuit is adjusted in an attempt to reduce the measured spurious noise. One source of spurious noise is a phase error between I and Q. To minimize noise, the phase register 510 is adjusted (step 1018) and measurements are repeated. The process of measuring, examining noise, and adjusting the phase is repeated until an acceptable level of noise is achieved. Gain and offset errors of the DACs 516 and 546 also contribute spurious noise. This noise may be addressed in a similar way, by adjusting the gain and/or offset of the DACs and measuring spurious noise. The DACs are then configured with the adjustments yielding acceptable (preferably minimum) levels of noise. The switch 736 is generally opened when calibration is complete.

The synthesizer 200 offers the advantages of low cost and low phase noise. The simplicity of its single-loop design reduces the amount of hardware needed, as compared with multi-loop designs. Its use of a quadrature DDS and single-sideband upconverter suppresses unwanted sidebands without the need for complex and expensive filters. In using a quadrature DDS and single-sideband upconverter, the synthesizer 200 also exploits a current trend in the wireless telecommunications industry of supplying precise, quadrature devices at low cost. Because the synthesizer 200 requires fewer parts than many competing designs, it can be constructed in a smaller volume. In the preferred embodiment, the synthesizer 200 fits in an instrument slot less than 1.8 cm tall within an ATE system. In addition, the various settings of the synthesizer 200, such as DDS CLK selection, LO selection, upper or lower sideband selection, YIG frequency, and prescaler values, often provide multiple choices to a user for configuring the synthesizer 200 to produce any desired output frequency. These choices enable a user to select the configuration that gives the best possible noise performance.

Having described one embodiment, numerous alternative embodiments or variations can be made. As shown and described, the DDS modulation circuit 212 receives its clock reference from the reference oscillator 210. This is merely an example, however. Alternatively, the DDS modulation circuit can have its own clock reference, or can receive a clock reference from another source.

As shown and described, the DDS modulation circuit 212 is provided with a plurality of local oscillators. This is not strictly required. Alternatively, a single local oscillator can be used. The single local oscillator can be a fixed frequency oscillator or can provide multiple, selectable frequencies.

Those skilled in the art will therefore understand that various changes in form and detail may be made to the embodiments disclosed herein without departing from the scope of the invention.

What is claimed is:

1. A microwave synthesizer, comprising:
   a reference oscillator for generating a reference frequency;
   a DDS modulation circuit for generating a modulated DDS signal; and
   a phase-locked loop circuit, coupled to the reference oscillator and the DDS modulation circuit, for generating a variable frequency output signal,
   wherein the phase-locked loop circuit includes—
   a phase comparison circuit having a first input coupled to the reference oscillator, a second input for receiving a feedback signal, and an output,
   a controllable oscillator having a control input coupled to the output of the phase comparison circuit and an output for generating the variable frequency output signal, and
   a first mixer circuit having a first input coupled to the DDS modulation circuit, a second input coupled to the output of the controllable oscillator, and an output coupled to the second input of the phase comparison circuit, and
   wherein the DDS modulation circuit includes
   a local oscillator circuit,
   a DDS circuit, having a clock input coupled to the local oscillator circuit and an output for providing an output signal of programmable frequency, and
   a second mixer circuit having a first input coupled to the output of the DDS circuit, a local oscillator input coupled to the local oscillator circuit, and an output for generating the modulated DDS signal.

2. A microwave synthesizer as recited in claim 1, further comprising a programmable divider coupled in series between the output of the controllable oscillator and the second input of the mixer circuit.

3. A microwave synthesizer as recited in claim 2, wherein the programmable divider comprises a programmable-ratio RF prescaler.

4. A microwave synthesizer as recited in claim 1, wherein the phase comparison circuit comprises a phase-frequency detector.

5. A microwave synthesizer as recited in claim 1, wherein the phase comparison circuit comprises a crossover switch coupled in series with a phase detector.

6. A microwave synthesizer as recited in claim 1, wherein the controllable oscillator comprises a YIG oscillator.

7. A microwave synthesizer as recited in claim 1, wherein the DDS circuit comprises:
   a first DDS unit having a clock input coupled to the local oscillator circuit and an output for providing an output signal of programmable frequency,
   a second DDS unit having a clock input coupled to the local oscillator circuit and an output for providing an output signal of programmable frequency,
   wherein the second mixer circuit is a quadrature mixer circuit further having a second input coupled to the output of the second DDS unit.

8. A microwave synthesizer as recited in claim 7, wherein at least one of the first and second DDS units is adjustable for phase.

9. A method of calibrating a microwave synthesizer as recited in claim 8, comprising:
   programming the first and second DDS units to produce respective output signals having the same frequency;
   A) sampling the feedback signal;
   B) analyzing the feedback signal to determine its spurious content;
   C) adjusting the phase between the output signals of the first and second DDS units;
   D) identifying a phase that yields a lower level of spurious content in the feedback signal than other phases; and
   E) programming the phase between the first and second DDS units to a value substantially equal to the identified phase.

10. A microwave synthesizer as recited in claim 7, wherein the quadrature mixer circuit comprises a single-sideband upconverter.

11. A microwave synthesizer as recited in claim 7, further comprising a sampling circuit coupled to the output of the first mixer circuit, for sampling the feedback signal.

12. A microwave synthesizer as recited in claim 7, wherein at least one of the first and second DDS units is adjustable for gain.

13. A microwave synthesizer as recited in claim 7, wherein at least one of the first and second DDS units is adjustable for offset.

14. A microwave synthesizer as recited in claim 1, wherein the local oscillator circuit comprises:
   a plurality of frequency multiplying units each having an input coupled to the reference oscillator and each having an output for providing an output frequency that is a multiple of the reference frequency;
   a first selector having a plurality of inputs each coupled to the output of one of the plurality of frequency multiplying units and having an output coupled to the DDS circuit; and
   a second selector having a plurality of inputs each coupled to the output of one of the plurality of frequency multiplying units and having an output coupled to the second mixer circuit.

15. A method of programming a microwave synthesizer as recited in claim 14 to achieve a desired frequency, comprising:
   A) selecting one of the frequency multiplying units for providing input to the DDS circuit;
   B) selecting one of the frequency multiplying units for providing input to the second mixer circuit; and
   C) programming the DDS circuit to produce an output frequency.

16. A method of programming a microwave synthesizer as recited in claim 1 to achieve a desired frequency, comprising:
   A) programming the DDS circuit to output a signal having a first frequency;
   B) waiting a first predetermined interval of time;
   C) programming the DDS circuit to output a signal having a second frequency;
   D) waiting a second predetermined interval of time; and
   E) repeating steps A-D,
   wherein the phase-locked loop circuit has a bandwidth, and the inverse of the sum of the first predetermined interval of time and the second predetermined interval of time is greater than the bandwidth.

17. A microwave synthesizer, comprising:
   a phase comparison circuit having a first input for receiving a reference frequency, a second input for receiving a feedback signal, and an output;
   a controllable oscillator having a control input coupled to the output of the phase comparison circuit and an output for generating a variable frequency output signal;
   a programmable divider having an input coupled to the output of the controllable oscillator and an output for providing a divided signal;
   a first mixer circuit having a first input adapted for receiving a modulated signal, a second input coupled to the output of the programmable divider, and an output coupled to the second input of the phase comparison circuit for providing the feedback signal; and
   a DDS modulation circuit including
      a frequency multiplying circuit having an input for receiving the reference frequency,
      a DDS circuit having a clock input coupled to the frequency multiplying circuit and an output for providing a programmable, periodic signal, and
      a second mixer circuit having a first input coupled to the output of the DDS circuit, a second input coupled to the frequency multiplying circuit, and an output for providing the modulated signal.

18. A microwave synthesizer as recited in claim 17, wherein the phase comparison circuit comprises a phase-frequency detector having first and second inputs.

19. A microwave synthesizer as recited in claim 18, wherein the phase comparison circuit further comprises a crossover switch having first and second inputs coupled to the first and second inputs of the phase comparison circuit and first and second outputs coupled to first and second inputs of the phase-frequency detector.

20. A microwave synthesizer as recited in claim 17, wherein the frequency multiplying circuit comprises:
   a plurality of frequency multiplying units each having an input for receiving the reference frequency and each having an output for providing an output frequency that is a multiple of the reference frequency; and
   a selector having a plurality of inputs each coupled to the output of one of the plurality of frequency multiplying units and having an output coupled to the clock input of the DDS circuit.

21. A microwave synthesizer as recited in claim 20, wherein the selector is a first selector, and the frequency multiplying circuit further comprises:
   a second selector having a plurality of inputs each coupled to the output of one of the plurality of frequency multiplying units and having an output coupled to the second input of the second mixer circuit.

22. A microwave synthesizer, comprising:
   a reference oscillator for generating a reference frequency;
   a plurality of frequency multiplying units, coupled to the reference oscillator, for generating respective output signals each at a different multiple of the reference frequency;
   a first DDS unit having a clock input coupled to the plurality of frequency multiplying units and an output for generating a first DDS signal having a programmable frequency and a first phase;
   a second DDS unit having a clock input coupled to the plurality of frequency multiplying units and an output for generating a second DDS signal having the programmable frequency and a second chase different from the first phase;
   a quadrature mixer circuit having a first and second inputs respectively coupled to the outputs of the first and second DDS circuits, a third input coupled to the plurality of frequency multiplying units, and an output; and
   a phase-locked loop circuit, having a first input coupled to the reference oscillator, a second input coupled and to the output of the quadrature mixer circuit, and an output for providing a variable frequency output signal,
   wherein the phase-locked loop circuit includes
   a phase comparison circuit having a first input coupled to the reference oscillator, a second input for receiving a feedback signal, and an output;
   a controllable oscillator having a control input coupled to the output of the phase comparison circuit and an output for generating a variable frequency output signal;
   a programmable divider having an input coupled to the output of the controllable oscillator and an output for providing a divided signal; and
   a mixer circuit having a first input coupled to the output of the quadrature mixer circuit, a second input coupled to the output of the programmable divider, and an output coupled to the second input of the phase comparison circuit for providing the feedback signal.

23. A microwave synthesizer as recited in claim 22, further comprising a sampling circuit coupled to the output of the mixer circuit for sampling the feedback signal.

24. A microwave synthesizer, comprising:
   a phase comparator having a first input, a second input, and an output, the first input for receiving a reference frequency;
   a controllable oscillator having an input and an output, the input coupled to the output of the phase comparator;
   a first mixer having a first input, a second input, and an output, the second input coupled to the output of the controllable oscillator and the output coupled to the second input of the phase comparator;
   a frequency multiplier having an input and an output, the input for receiving the reference frequency,
   a DDS having an input and an output, the input coupled to the output of the frequency multiplier, and
   a second mixer having a first input coupled to the output of the DDS, a second input coupled to the output of the frequency multiplier, and an output coupled to the first input of the first mixer.

25. A microwave synthesizer, comprising:
a reference oscillator for generating a reference frequency;
a plurality of frequency multiplying units, coupled to the reference oscillator, for generating respective output signals each at a different multiple of the reference frequency;
a first DDS unit having a clock input coupled to the plurality of frequency multiplying units and an output for generating a first DDS signal having a programmable frequency and a first phase;
a second DDS unit having a clock input coupled to the plurality of frequency multiplying units and an output for generating a second DDS signal having the programmable frequency and a second phase different from the first phase;
a quadrature mixer circuit having a first and second inputs respectively coupled to the outputs of the first and second DDS circuits, a third input coupled to the plurality of frequency multiplying units, and an output; and
a phase-locked loop circuit including—
a phase comparison circuit having a first input, a second input, and an output, the first input coupled to the reference oscillator, and
a mixer having a first input coupled to the output of the phase comparison circuit, a second input coupled to the output of the quadrature mixer circuit, and an output coupled to the second input of the phase comparison circuit.

* * * * *